United States Patent

Choi

[11] Patent Number: 5,943,642
[45] Date of Patent: Aug. 24, 1999

[54] METHOD OF DESIGNING SUBBAND DIGITAL FILTER BANK

[75] Inventor: Han-Mook Choi, Suwon, Rep. of Korea

[73] Assignee: SamSung Electronics Co., Ltd., Suwon, Rep. of Korea

[21] Appl. No.: 08/963,104

[22] Filed: Nov. 3, 1997

[30] Foreign Application Priority Data

Nov. 1, 1996 [KR] Rep. of Korea ............ 96-51582

[51] Int. Cl.$^6$ ............... G06F 7/00; H04K 1/10
[52] U.S. Cl. ............ 702/197; 702/196; 708/300; 375/350
[58] Field of Search ............ 702/196, 197; 364/724.011, 736.03, 724.1; 375/260, 350; 348/398, 402–403, 413; 704/220; 370/484; 708/290, 300

[56] References Cited

U.S. PATENT DOCUMENTS

| | | | |
|---|---|---|---|
| 4,799,179 | 1/1989 | Masson et al. | 364/724.1 |
| 5,136,374 | 8/1992 | Jayant et al. | 348/398 |
| 5,182,645 | 1/1993 | Breeuwer et al. | 348/458 |
| 5,323,391 | 6/1994 | Harrison | 370/484 |
| 5,610,944 | 3/1997 | Mau et al. | 375/260 |

*Primary Examiner*—John Barlow
*Assistant Examiner*—Bryan Bui
*Attorney, Agent, or Firm*—Marger Johnson & McCollom, P.C.

[57] ABSTRACT

A method of designing a subband digital filter bank having first and second analysis filters with a 2-band linear phase satisfies a perfect reconstruction (PR) condition and has transfer functions H0(z) and H1(z) separated into first and second polyphase components Hi0(z) and Hi1(z). The method includes designing H0(z) which is odd-symmetric or antisymmetric and has a degree of 2m+1, converting the PR condition into a matrix form, obtaining H11(z) according to the matrix obtaining H10(z) using H11(z), obtaining H1(z) from H10(z) and H11(z), and obtaining a general second transfer function H1'(z) using H0(z) and H1(z). The filter characteristic of the second analysis filter is adjusted by adjusting x1, and the symmetry or antisymmetry thereof is determined by K.

5 Claims, 1 Drawing Sheet

METHOD OF DESIGNING SUBBAND DIGITAL FILTER BANK

BACKGROUND OF THE INVENTION

1. Field of the Invention

The present invention relates to a multifrequency filter bank, and more particularly to a method of designing a subband filter bank.

2. Description of the Related Art

A filter bank is a group of filters used for passing various frequency bands. A number of filters may exist for each frequency band. Subband filter banks have diverse applications in audio and video data compression.

FIG. 1 is a block diagram of a 2-band filter bank. The 2-band filter bank comprises a receiving section 10, transmission section 20, and sending section 30. The receiving section includes first and second analysis filters 12 and 14 and first and second decimators 16 and 18. The sending section 30 includes first and second expanders 32 and 34, first and second synthesis filters 36 and 38, and an adder/subtractor 40. Here, H0(Z), H1(Z), G0(Z), and G1(Z) are transfer functions of the corresponding filters.

According to the subband filter bank of FIG. 1, the decimators 16 and 18 are connected to the output of the analysis filter 12 and 14, respectively. The decimators 16 and 18 may alternatively be connected to the inputs of the analysis filters 12 and 14 in other multirate filter banks.

The first and second analysis filters 12 and 14 receive a digital signal x(n), filter predetermined frequency bands and output a filtered digital signal [x'(n)] to the first and second decimators 16 and 18, respectively. The first and second decimators 16 and 18 filter components whose indexes are even-numbered and output the filtered components to the transmission section 20.

The first and second expander 32 and 34 interpolate '0' into the digital signal of the even-numbered components, for example, x'(0), x'(2), etc., from the transmission section 20. The interpolated signal is output to the corresponding synthesis filter 36 or 38. The reason why the expander 32 or 34 interpolates '0' between x'(0) and x'(2) is to match the Nyquist sampling rate. The adder/subtractor section 40 adds or subtracts the digital signal interpolated through the synthesis filters 36 and 38 and produces an output signal y(n) in which the input signal x(n) is delayed for a predetermined time r, that is, y(n)=x(n−r).

A conventional method of designing a filter bank which has a 2-band liner phase (LP) and satisfies a perfect reconstruction (PR) condition involves first designing, the first and second analysis filters 12 and 14. The synthesis filters are then designed corresponding to the designed analysis filters 12 and 14. Since complex operations such as solving non-linear equations are required, it is almost impossible to design the filters using a system with limited processing capacity such as a personal computer.

SUMMARY OF THE INVENTION

It is an object of the present invention to solve the problems involved in the related art, and to provide a less computationally exhaustive method for designing a subband digital filter bank having an analysis filter with a 2-band linear phase and satisfying a perfect reconstruction condition.

A subband digital filter bank has first and second analysis filters and a 2-band linear phase. The filter satisfies a perfect reconstruction condition and has first and second transfer functions H1(z) and H1(z) separated into first and second polyphase components H10(z) and H11(z), respectively.

The method comprises the steps of designing a first transfer function H0(z) which is odd-symmetric or antisymmetric and has a predetermined degree of 2m+1. The method converts the perfect reconstruction condition into a matrix form, $$(I+J) \cdot P1 \cdot b = X$$

where, I denotes a unit matrix having a size of 2m+1, J denotes a skew unit matrix having a size of 2m+1 and P1 denotes a matrix having a size of (2m+1)*(m+1) obtained by dividing a matrix such $$\text{as } [P1 | P2] = \begin{bmatrix} R[H00, H01] \\ 0 \end{bmatrix}.$$

A column vector b has a size of (m+1)*1 whose i-th element represents a coefficient of $Z^{i-1}$ of the second polyphase component H11(z), and X denotes a matrix $X=[0 \ldots 0 \ 1 \ 0 \ldots 0]^T$ having a size of 2m*1. A matrix $A=(I+J) \cdot P1$ is used to obtain the column vector b and matrix A is used to obtain the second polyphase component H11(z). The column vector b is obtained using the matrix A as follows, $$b = (A^T A)^{-1} A^T X$$

The first polyphase component H10(z) is obtained using the second polyphase component H11(z) in accordance with an equation, $$H10(z) = +(-)z^K H11(z^{-1}).$$

The second transfer function H1(z), which has a lowest coefficient and which is odd-antisymmetric or symmetric is obtained from the first and second polyphase components H10(z) and H11(z) using an equation, $$H1(z) = H10(z^2) + zH11(z^2).$$

A general second transfer function H1'(z) is obtained using H0(z) and H1(z) in accordance with a following equation, $$H1'(z) = X(z^2)H0(z) + z^{2K}H1(z)$$

where, $$X(z) = \sum_{I=0}^{K-1} X_I(z^I - z^{2K-1}).$$

A filter characteristic of the second analysis filter is adjusted by adjusting x1, and the symmetry or antisymmetry thereof is determined by K.

The above object, and other features and advantages of the invention will become apparent by describing the preferred embodiment thereof with reference to the accompanying drawings.

DETAILED DESCRIPTION OF PREFERRED EMBODIMENT

Figure 2:
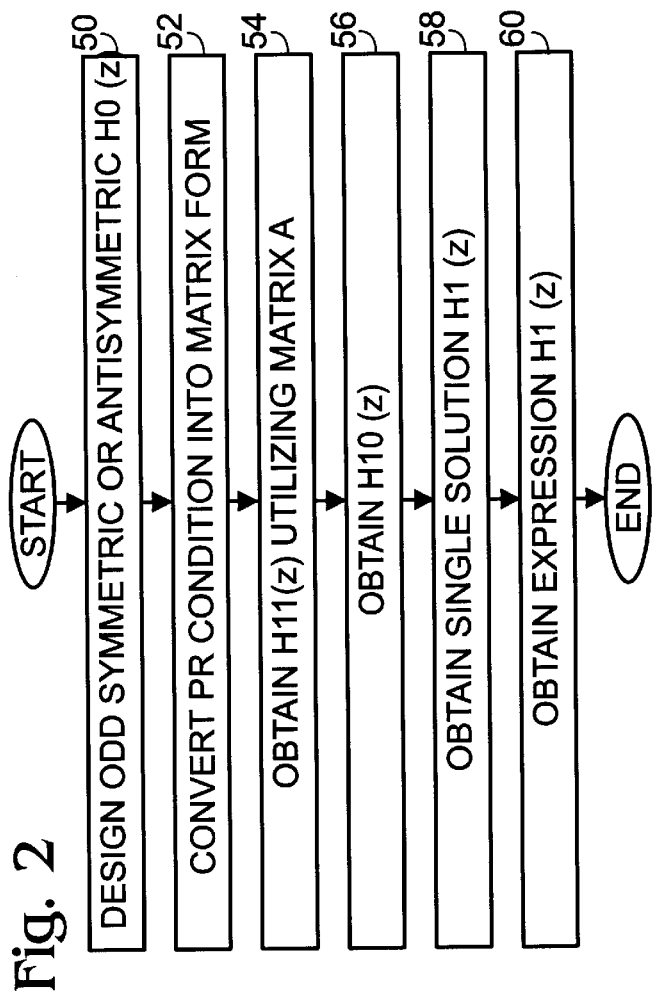
FIG. 2 is a flow diagram for designing a subband digital filter bank according to the present invention.

FIG. 2 shows a flow chart explaining the method of designing the subband digital filter bank according to the present invention. A transfer function H0(z) of a first analysis filter is designed in step 50. A polyphase component H11(z) is obtained by converting a PR condition into a matrix form in steps 52 and 54. A polyphase component H10(z) is derived according to the polyphase component H11(z) in step 56. A transfer function H1(z) is then derived from the first and second polyphase components in step 58 and a general transfer function H1'(z) derived in step 60.

According to the subband digital filter bank designing method, one of two analysis filters is first designed in step 50. The transfer function of the other analysis filter is then derived from the transfer function of the designed analysis filter in steps 52 through 60.

For clarity, the present invention is described such that the transfer function of the analysis filter designed in step 50 is H0(z), the transfer function of the analysis filter to be designed according to the present invention is H1(z), H0(z) is odd-symmetric or antisymmetric, and the degree of H0(z) is 2m+1. However, it should be understood that the invention is equally applicable to first designing the transfer function H1(z) and then deriving the transfer function H0(z).

Figure 1:
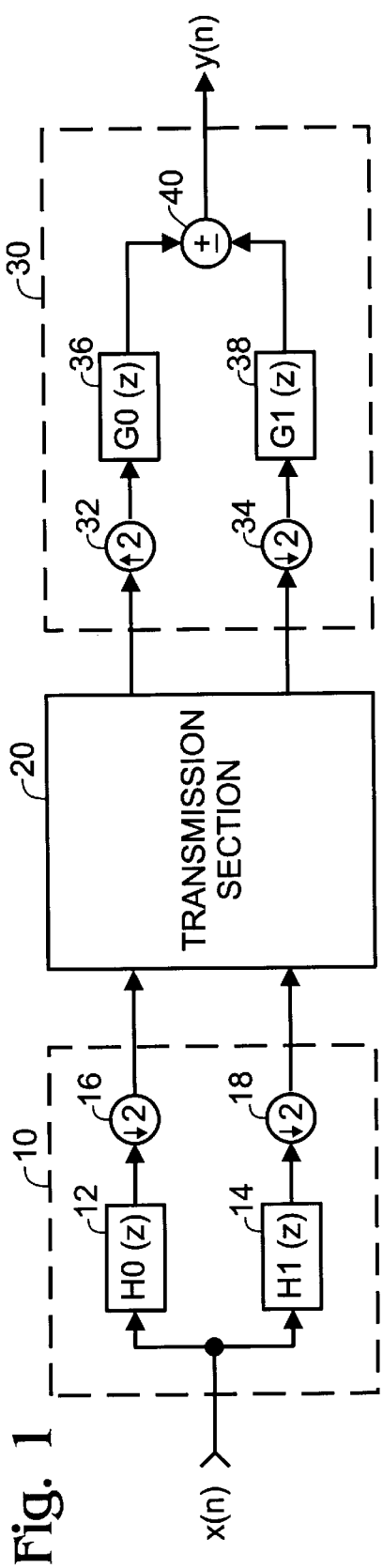
FIG. 1 is a block diagram of a 2-band filter bank.

A linear phase is obtained for H1(z) to satisfy a PR condition from H0(z). If the analysis filter and the synthesis filter as shown in FIG. 1 have linear phase, the transfer function Hi(z) of the analysis filter and the transfer function Gi(z) of the synthesis filter are given by $$Hi(z)=+(-)z^N Hi(z^{-1}), \; Gi(z)=+(-)z^N Gi(z^{-1}) \quad \text{Eq. (1)}$$

where, N is the degree of the filter, and the sign (+) of the transfer function represents a symmetric filter while the sign (−) represents an antisymmetric filter.

Meanwhile, if the output y(n) presents the delay of the input x(n) in the 2-band filter bank structure of FIG. 1, the system of FIG. 1 is called a 2-band perfect reconstruction filter bank (PRFB). In accordance with the PR condition, the filter may be expressed as Hi(z) and Gi(z), or as polyphase components.

Here, if the transfer functions of the analysis and synthesis filters are polynomials, the transfer functions can be derived from polyphase components as a following equation $$Hi(z)=Hi0(z^2)+zHi1(z^2), \; Gi(z)=Gi0(z^2)+zGi1(z^2) \quad \text{Eq. (2)}$$

where, Hik and Gik are polyphase components of Hi and Gi.

Also, the polyphase matrices H and G of the analysis filter and the synthesis filter are defined by $$H = \begin{bmatrix} H00 & H01 \\ H10 & H11 \end{bmatrix}, \; G = \begin{bmatrix} G00 & G11 \\ G00 & G10 \end{bmatrix} \quad \text{Eq. (3)}$$

Here, if Hi(z) satisfies the equation (1), i.e., has the linear phase property, and the degree N is an odd number, the polyphase component of the symmetric (or antisymmetric) filter has the property given by $$H00(z)=+(-)z^k H01(z^{-1}), \; H10(z)=+(-)z^k H11(z^{-1}) \quad \text{Eq. (4)}$$

where, k is (N−1)/2, and the respective polyphase components are symmetric or antisymmetric.

Next, if the system of FIG. 1 comprises finite impulse response (FIR) filters, the following PR conditions are well known. Condition 1) H00(z)·H11(z)−H01(z)·H10(z)=$z^L$, for L=integer which is not negative. Condition 2) G=$z^L$·H$^{-1}$ From the PR conditions as described above, the following two facts can be recognized. First, if H00 and H01 do not have a common root assuming that H00 and H01 have the degrees of N and M, respectively, are given, H10 and H11 satisfying the condition 1) always exist, and the unique H10 and H11 having the degrees of N−1 and M−1, respectively, exist. If H0(z) which is designed or given in step 50 is symmetric or antisymmetric, H1(z) to be designed by the method according to the present invention should also be symmetric or antisymmetric. Thus, it is not required to consider all the solutions satisfying the condition 1).

Second, if H0(z) which is odd-symmetric is given, the polyphase component of H0(z) is given by equation(4), and H1(z) which is odd-antisymmetric and satisfies the condition 1) always exists. Also, since a unique solution such as H0(z) exists, H1(z) which has a degree lower than that of H0(z) does not exist. If the degree of H0(z) is N, the degree of H1(z) will be N+4k (where, k=0, 1, . . . ), and if k=0, H1(z) will be a unique solution.

If H0(z) designed in the step 50 is odd-symmetric or antisymmetric, and the degree thereof is 2m+1, the PR condition 1) is converted into a determinant of a matrix given in step 52 by, $$(I+J) \cdot P1 \cdot b = X \quad \text{Eq. (5)}$$

where, I denotes a unit matrix having a size of 2m+1, and J is a skew unit matrix having a size of 2m+1.

P1 in equation (5) is a (2m+1)*(m+1)-sized matrix obtained by dividing a matrix such as, $$[P1 \mid P2] = \begin{bmatrix} R[H00, H01] \\ 0 \end{bmatrix}. \quad \text{Eq. (6)}$$

A column vector b has a size of (m+1)*1 whose i-th element represents the coefficient of $Z^{i-1}$ of H11(z), and X is a (2m*1)-sized matrix X=$[0 \ldots 0 \; 1 \; 0 \ldots 0]^T$.

In the equation (6), R denotes a resultant matrix. If two polynomials D and N are given as, $$D = \sum_{K=0}^{n} D_K Z^K, \; N = \sum_{K=0}^{m} N_K Z^K$$

a resultant matrix is analyzed to easily discriminate whether or not the two polynomials have a common root.

If D and N do not have a common root, the following matrix R[D, N] has its inverse. However, if the inverse of the matrix R[D, N] does not exist, D and N should have a common root.

$$R[D, N] = \begin{bmatrix} D0 & 0 & \ldots & 0 & N0 & 0 & \ldots & 0 \\ D1 & D0 & \ldots & 0 & . & . & \ldots & . \\ D2 & D1 & \ldots & 0 & N_m & N_{m-1} & \ldots & N0 \\ . & . & \ldots & . & 0 & N_m & \ldots & N1 \\ D_n & D_{n-1} & \ldots & D0 & . & . & \ldots & . \\ 0 & D_n & \ldots & D1 & 0 & 0 & \ldots & . \\ . & . & \ldots & . & . & . & \ldots & . \\ 0 & 0 & \ldots & D_n & 0 & 0 & \ldots & N_m \end{bmatrix}$$

After the step 52, the matrix A=(I+J)*P1 is obtained in step 54. The matrix A has a size of (2m+1)*(m+1), and has a full column rank. Accordingly, the vector b is obtained by $$b=(A^T A)^{-1} A^T X \quad \text{Eq. (7)}$$

The coefficient of H11 is obtained from equation (7), and then H11 is obtained from the coefficient of H11 in step 54. After step 54, H10(z) is obtained by substituting H11(z) in equation (4) in step 56. After step 56, a unique solution H1(z) which has the lowest coefficient and satisfies the PR condition is obtained by substituting H10(z) and H11(z) obtained at the steps 54 and 56 in step 58.

In view of the design aspect, the unique solution H1(z) obtained at step 58 may not have a desired frequency characteristic. Accordingly, a general transfer function [H1'(z)] satisfying the PR condition is obtained by substituting H1(z) in the following equation in step 60.

$$H1'(z)=X(z^2)H0(z)+z^{2K}H1(z) \qquad \text{Eq. (8)}$$

where, $$X(z) = \sum_{I=0}^{K-1} X_I(z^I - z^{2K-1}).$$

With respect to a certain x1, transfer functions H0(z) and H1'(z) of a new pair of analysis filters will satisfy the PR condition. Here, x1 is a free parameter for designing a filter having a transfer function H1'(z), and the filter characteristic is varied according to the free parameter. As K is increased by 1, one more free parameter is obtained, and the degree of H1'(z) is increased by 2.

The transfer function of the synthesis filter of each band can be obtained by the transfer function of the analysis filter obtained from the second condition of the PR at step 60.

Thus, according to the present invention, a filter having a 2-band linear phase and satisfying a perfect reconstruction condition can be designed in a less computationally exhaustive manner by means such as a personal computer.

While the present invention has been described and illustrated herein with reference to the preferred embodiment thereof, it will be understood by those skilled in the art that various changes in form and details may be made therein without departing from the spirit and scope of the invention.

What is claimed is:

1. A method of using a subband digital filter bank to process audio or video data, the digital filter bank having first and second analysis filters, a 2-band linear phase, satisfying a perfect reconstruction condition, and having first and second transfer functions H0(z) and H1(z) separated into first and second polyphase components Hi0(z) and Hi1(z), respectively, the method comprising the steps of:

designing a first transfer function H0(z) which is odd-symmetric or antisymmetric and has a predetermined degree of 2m+1;

converting the perfect reconstruction condition into a matrix form (I+J)·P1·b=X, where I denotes a unit matrix having a size of 2m+1, J denotes a skew unit matrix having a size of 2m+1, P1 denotes a matrix having a size of (2m+1)*(m+1) obtained by dividing a matrix such as $$X(z) = \sum_{I=0}^{K-1} X_I(z^I - z^{2K-1});$$

b denotes a column vector matrix having a size of (m+1)*1 whose i-th element represents a coefficient of $Z^{i-1}$ of the second polyphase component H11(z), and X denotes a matrix X=[0 . . . 0 1 0 . . . 0]$^T$ having a size of 2m*1;

obtaining a matrix A=(I+J)·P1;

obtaining the second polyphase component H11(z) from the column vector matrix obtained by an equation b=(A$^T$A)$^{-1}$A$^T$X using the matrix A;

obtaining the first polyphase component H10(z) using the second polyphase component H11(z) according to an equation H10(z)=+(-)z$^K$H11(z$^{-1}$), where K is equal to (N-1)/2 and N is an odd degree of the digital filter bank;

obtaining the second transfer function H1(z), which has a lowest coefficient and which is odd-antisymmetric or symmetric, from the first and second polyphase components H10(z) and H11(z) using an equation H1(z)=H10(z$^2$)+zH11(z$^2$);

obtaining a general second transfer function H1'(z) using H0(z) and H1(z) in accordance with an equation H1'(z)=X(z$^2$)H0(z)+z$^{2K}$H1(z), where, $$X(z) = \sum_{I=0}^{K-1} X_I(z^I - z^{2K-1});$$

wherein X is the input data and a filter characteristic of the second analysis filter is adjusted by adjusting x1, and a symmetry or antisymmetry thereof is determined by K; and compressing the audio or video data by applying the subband digital filter bank to the audio or video input data.

2. A method for designing first and second analysis filters for filtering data having a 2-band linear phase and satisfying a perfect reconstruction (PR) condition; comprising:

designing a first transfer function H0(z) which is odd-symmetric or antisymmetric and has a predetermined degree of 2m+1 where m is an integer;

converting the PR condition into a matrix form (I+J)·P1·b=X, where I denotes a unit matrix, J denotes a skew unit matrix, P1 denotes a matrix, b denotes a column vector matrix whose i-th element represents a coefficient of $Z^{i-1}$ of a polyphase component H11(z), and X denotes a matrix;

deriving a matrix A=(I+J)·P1;

deriving the polyphase component H11(z) from the column vector obtained according to the column vector matrix b=(A$^T$A)$^{-1}$A$^T$X;

deriving a polyphase component H10(z) using the polyphase component H11(z) according to the equation H10(z)=+(-)z$^K$H11(z$^{-1}$);

deriving H1(z) from H10(z) and H11(z) according to the equation H1(z)=H10(z$^2$)+zH11(z$^2$);

deriving a general second transfer function H1'(z) for the second analysis filter using H0(z) and H1(z) according to the equation H1'(z)=X(z$^2$)H0(z)+z$^{2K}$H1(z) where, $$X(z) = \sum_{I=0}^{K-1} X_I(z^I - z^{2K-1});$$

and adjusting a filter characteristic of the second analysis filter by adjusting X1, and adjusting symmetry or antisymmetry of H1'(z) by varying K, where K is equal to (N-1)/2 and N is an odd degree of the digital filter bank.

3. A method according to claim 2 wherein H0(z) is odd-symmetric or antisymmetric and has a predetermined degree of 2m+1, I has a size of 2m+1, J has a size of 2m+1, P1 has a size of (2m+1)*(m+1); deriving b has a size of (M+1)*1, and X denotes a matrix X=[0 . . . 0 1 0 . . . 0]$^T$ having a size of 2m*1.

4. A method according to claim 2 wherein P1 is obtained by deriving a matrix $$[P1 | P2] = \begin{bmatrix} R[H00, H01] \\ 0 \end{bmatrix},$$

where R denotes a resultant matrix.

5. A subband digital filter bank for compressing an audio or video input data, the digital filter bank comprising:
- first and second analysis filters including a 2-band linear phase, satisfying a perfect reconstruction condition, and having first and second transfer functions H0(z) and H1(z) separated into first and second polyphase components Hi0(z) and Hi1(z), respectively;
- the first transfer function H0(z) being odd-symmetric or antisymmetric and having a predetermined degree of 2m+1;
- the perfect reconstruction condition converted into a matrix form (I+J)·P1·b=X, where, I denotes a unit matrix having a size of 2m+1, J denotes a skew unit matrix having a size of 2m+1, P1 denotes a matrix having a size of (2m+1)*(m+1) obtained by dividing a matrix such as $$[P1 | P2] = \begin{bmatrix} R[H00, H01] \\ 0 \end{bmatrix},$$

b denotes a column vector matrix having a size of (m+1)*1 whose i-th element represents a coefficient of $Z^{i-1}$ of the second polyphase component H11(z), and X denotes a matrix $X=[0 \ldots 0 \ 1 \ 0 \ldots 0]^T$ having a size of 2m*1;
- the second polyphase component H11(z) obtained from the column vector matrix obtained according to $b=(A^TA)^{-1}A^TX$ using a matrix A=(I+J)·P1;
- the first polyphase component H10(z) obtained using the second polyphase component H11(z) according to an equation $H10(z)=+(-)z^K H11(z^{-1})$, where K is equal to (N−1)/2 and N is an odd number representing a degree of the digital filter bank;
- the second transfer function H1(z), which has a lowest coefficient and which is odd-antisymmetric or symmetric obtained from the first and second polyphase components H10(z) and H11(z) using an equation $H1(z)=H10(z^2)+zH11(z^2)$;
- a general second transfer function H1'(z) obtained using H0(z) and H1(z) in accordance with an equation $H1'(z)=X(z^2)H0(z)+z^{2K}H1(z)$, where, $$X(z) = \sum_{I=0}^{K-1} X_I(z^I - z^{2K-1});$$

wherein X is the input data and a filter characteristic of the second analysis filter is adjusted by adjusting x1, and a symmetry or antisymmetry thereof is determined by K; and
- the audio or video data is compressed by applying the subband digital filter bank to the audio or video input data.

* * * * *